(12) United States Patent
Chen et al.

(10) Patent No.: US 8,581,259 B2
(45) Date of Patent: Nov. 12, 2013

(54) DISPLAYING DEVICE WITH PHOTOCURRENT-REDUCING STRUCTURE AND METHOD OF MANUFACTURING THE SAME

(75) Inventors: Tung-Yu Chen, Tainan (TW); Liu-Chung Lee, Pingtung County (TW)

(73) Assignee: AU Optronics Corp., Hsin-Chu (TW)

( * ) Notice: Subject to any disclaimer, the term of this patent is extended or adjusted under 35 U.S.C. 154(b) by 1317 days.

(21) Appl. No.: 11/254,726

(22) Filed: Oct. 21, 2005

(65) Prior Publication Data

US 2006/0273318 A1    Dec. 7, 2006

(30) Foreign Application Priority Data

Jun. 1, 2005   (TW) ............................... 94118075 A

(51) Int. Cl.
- *H01L 27/14* (2006.01)
- *H01L 29/04* (2006.01)
- *H01L 29/15* (2006.01)
- *H01L 31/036* (2006.01)

(52) U.S. Cl.
USPC ................... 257/72; 257/59; 349/38; 349/39; 349/42; 349/122; 349/138; 349/142

(58) Field of Classification Search
USPC ........... 257/59, 72; 349/38, 42, 122, 138, 142
See application file for complete search history.

(56) References Cited

U.S. PATENT DOCUMENTS

| | | | |
|---|---|---|---|
| 5,478,766 A | 12/1995 | Park et al. | |
| 6,144,422 A | 11/2000 | Lee | |
| 6,278,504 B1* | 8/2001 | Sung | 349/46 |
| 7,088,401 B1* | 8/2006 | Ihara et al. | 349/39 |
| 2002/0171782 A1* | 11/2002 | Yee et al. | 349/43 |
| 2005/0140836 A1* | 6/2005 | Choi | 349/40 |
| 2007/0052020 A1* | 3/2007 | Chen et al. | 257/347 |

FOREIGN PATENT DOCUMENTS

| | | |
|---|---|---|
| CN | 1165568 A | 11/1997 |
| CN | 1405865 A | 3/2003 |

* cited by examiner

*Primary Examiner* — Meiya Li
(74) *Attorney, Agent, or Firm* — Bacon & Thomas, PLLC

(57) ABSTRACT

A displaying device includes a substrate, a gate electrode formed on the substrate, a gate insulating layer, a gate a-Si region covering the gate electrode, a source metal region, a drain metal region, a data-line (DL) metal region, a passivation layer and a conductive layer. The gate a-Si region is formed on the gate insulating layer. The source and drain metal regions are formed on the gate a-Si region. The DL metal region is formed on the gate insulating layer and separated from the drain metal region at an interval. The passivation layer formed on the gate insulating layer covers the source, drain, and DL metal regions. The first and second vias of the passivation layer expose partial surfaces of the DL and drain metal regions respectively. The conductive layer formed on the passivation layer covers the first and second vias for electrically connecting the DL and drain metal regions.

14 Claims, 6 Drawing Sheets

DISPLAYING DEVICE WITH PHOTOCURRENT-REDUCING STRUCTURE AND METHOD OF MANUFACTURING THE SAME

This application claims the benefit of Taiwan application Serial No. 94118075, filed Jun. 1, 2005, the subject matter of which is incorporated herein by reference.

BACKGROUND OF THE INVENTION

1. Field of the Invention

The invention relates in general to a displaying device and a method of manufacturing the same, and more particularly to a displaying device with photocurrent-reducing structure and a method of manufacturing the same.

2. Description of the Related Art

Normally, displaying devices such as thin film transistor LCD devices (TFT LCD) are manufactured according to a five-mask manufacturing process. However, during which process, the amorphous silicon (a-Si) layer is photosensitive and is likely to generate photocurrent and cause photocurrent leakage after being exposed to the light.

Referring to FIG. 1, a partial cross-sectional view of a TFT LCD device formed according to a conventional five-mask manufacturing process is shown. The array formed according to a conventional five-mask manufacturing process includes a gate electrode 11 formed by a first metal layer and disposed on a substrate, a gate insulating layer 13 made of silicon nitride, a gate electrode a-Si layer 15, an n+ a-Si layer 16 and a source electrode 17 formed by a second metal layer as shown in FIG. 1. A backlight module is disposed below the substrate to provide the displaying device with a light source. The photosensitivity of a-Si has already been taken into consideration when designing the five-mask manufacturing process of a TFT device, and the pattern of the a-Si layer 15 is designed to be indented into the gate electrode 11. That is, the gate electrode a-Si layer 15 can be completely blocked by the gate electrode 11 to reduce photocurrent leakage. However, part of the light would still be projected onto the gate electrode a-Si layer 15 via a reflection path, causing undesired photocurrent leakage. The reflection path 1 illustrates the reflection of the light between the first metal layer and the second metal layer as shown in arrows of FIG. 1.

In a four-mask manufacturing process, the a-Si layer and the second metal layer are formed in the same layer mask, so the a-Si layer exists under the pattern of the second metal layer. That is, the pattern of the a-Si layer can not be indented in the first metal layer. When the light of the backlight module is projected onto the second metal layer from behind the first metal layer, the light directly is projected onto the a-Si layer, causing even higher photocurrent leakage than the structure manufactured according a five-mask manufacturing process.

SUMMARY OF THE INVENTION

It is therefore an object of the invention to provide a displaying device and a method of manufacturing the same for reducing photocurrent leakage of displaying device.

The invention achieves the above-identified object by providing a displaying device at least including a substrate, a gate electrode, a gate insulating layer, a g-aSi region, a source metal region, a drain metal region, a data-line (DL) metal region, a passivation layer and a conductive layer. The gate electrode is formed on the substrate, and the gate insulating layer covers the gate electrode. The g-aSi region is formed on the gate insulating layer and correspondingly positioned above the gate electrode. The source metal region and a drain metal region are formed on the g-aSi region. The DL metal region is formed on the gate insulating layer and separated from the drain metal region at an interval. The passivation layer is formed on the gate insulating layer and covers the source metal region, the drain metal region and the DL metal region. The passivation layer includes a first via and a second via for respectively exposing partial surfaces of the DL metal region and partial surfaces of the drain metal region. The conductive layer is formed on the passivation layer and covers the first via and the second via for electrically connecting the DL metal region and the drain metal region.

The invention achieves the above-identified object by further providing a manufacturing method of a displaying device at least including the following steps of: forming a gate electrode on a substrate; forming a gate insulating layer for covering the gate electrode; forming a g-aSi region on the gate insulating layer, the g-aSi region being correspondingly positioned above the gate electrode; forming a source metal region, a drain metal region and a data-line (DL) metal region above the gate insulating layer, the DL metal region being separated from the drain metal region at an interval; forming a passivation layer on the gate insulating layer and covering the source metal region, the drain metal region and the DL metal region; forming a first via and a second via on the passivation layer for respectively exposing partial surfaces of the DL metal region and partial surfaces of the drain metal region; and forming a conductive layer on the passivation layer and covering the first via and the second via for electrically connecting the DL metal region and the drain metal region.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
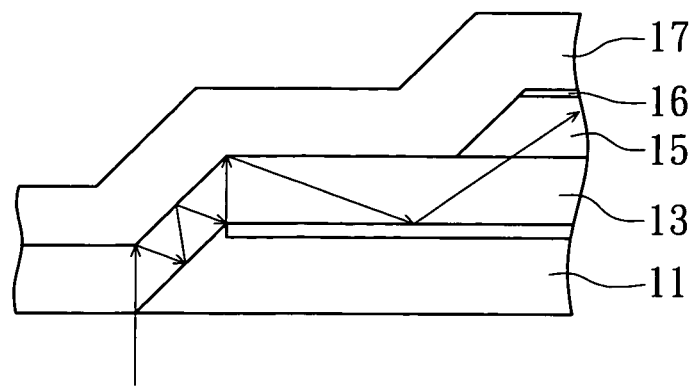
FIG. 1 (Related Art) is a partial cross-sectional view of a TFT LCD device formed according to a conventional five-mask manufacturing process.

The invention modifies the manufacturing process of a displaying device such as a TFT displaying device. The electrode and the data-line are disconnected first and then bridged via a transparent electrode, so that the electrode is indented in the gate electrode to reduce photocurrent leakage.

The invention is exemplified by the embodiments disclosed below. The first embodiment and the second embodiment respectively explain how to use the five-mask manufacturing process and the four-mask manufacturing process to manufacture a photocurrent-reducing TFT displaying device and the method of manufacturing the same. However, the embodiments disclosed below are not to limit the scope of protection of the invention. The technology of the invention is not limited to the modes disclosed in the embodiments.

Besides, non-critical devices are omitted in the drawings to make the embodiments of the invention prominent.

First Embodiment

Refer to FIG. 2A-2J, which illustrate a manufacturing method of a TFT displaying device according to a first embodiment of the invention. In the first embodiment, a five-mask manufacturing process is employed to manufacture a displaying device.

Figure 2A:
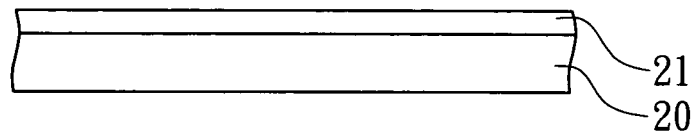
FIG. 2A-2J illustrate a manufacturing method of a TFT displaying device according to a first embodiment of the invention.
Figure 2B:
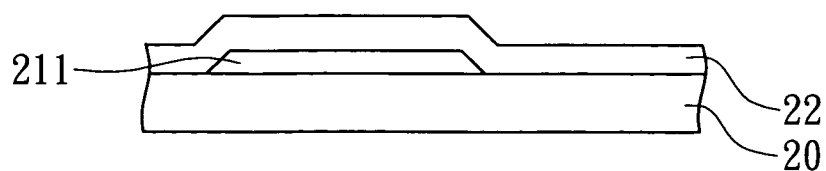

At first, a substrate 20 is provided, and a first metal layer 21 is formed on the substrate 20 as shown in FIG. 2A. Next, the first metal layer 21 is patterned to form a gate electrode 211, and a gate insulating layer 22 is formed on the substrate 20 and covers the gate electrode 211 as shown in FIG. 2B.

Figure 2C:
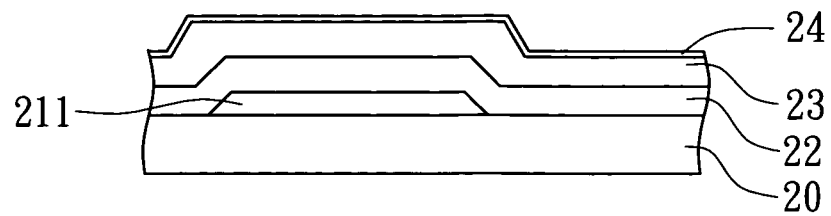
Figure 2D:
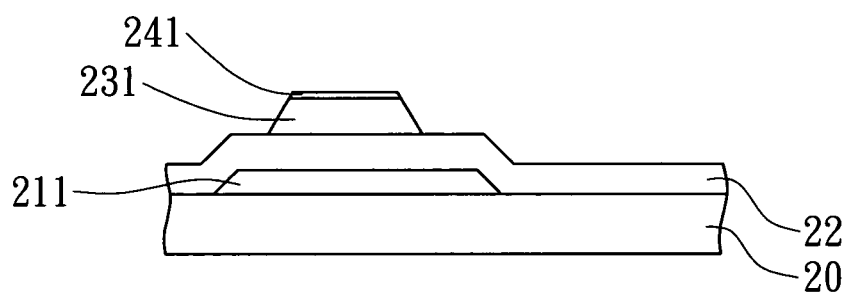

Then, an a-Si layer 23 is formed on the gate insulating layer, and a doped a-Si layer (such as n+ a-Si layer) 24 is formed on the a-Si layer 23 as shown in FIG. 2C. Next, the doped a-Si layer 24 and the a-Si layer 23 are patterned to form a doped g-aSi region 241 and a g-aSi region 231, which are correspondingly positioned above the gate electrode 211, as shown in FIG. 2D.

Figure 2E:
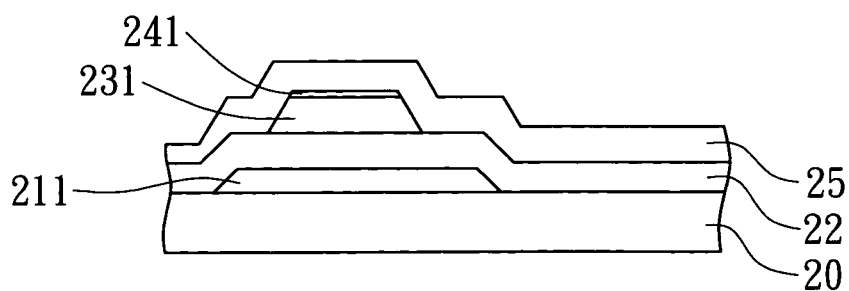

Afterwards, a second metal layer 25 is formed on the gate insulating layer 22 and covers the g-aSi region 231 and the doped g-aSi region 241 as shown in FIG. 2E.

Figure 2F:
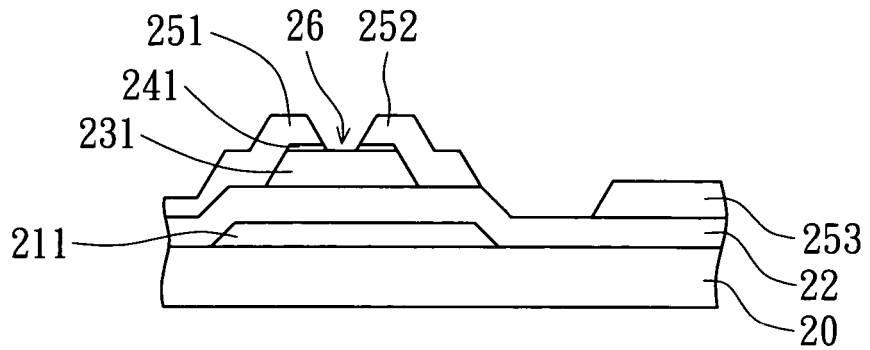

Next, the second metal layer 25 is patterned to form a source metal region 251, a drain metal region 252 and a DL metal region 253. A channel region 26 exists between the source metal region 251 and the drain metal region 252 which are separated at an interval from each other as shown in FIG. 2F.

Figure 2G:
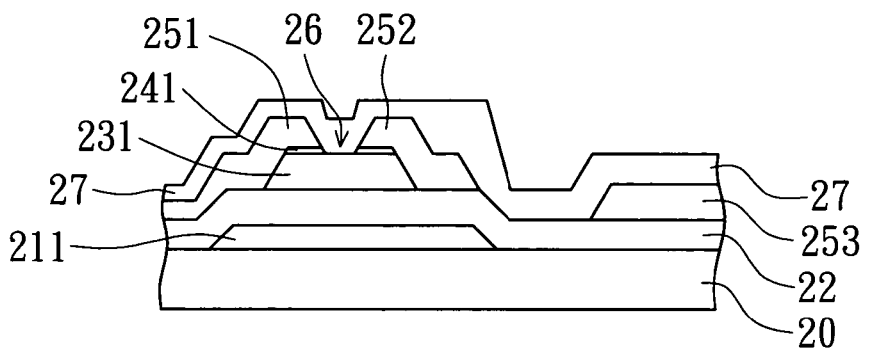

Then, a passivation layer 27 is formed on the gate insulating layer 22 and covers the source metal region 251, the drain metal region 252 and the DL metal region 253, as shown in FIG. 2G.

Figure 2H:
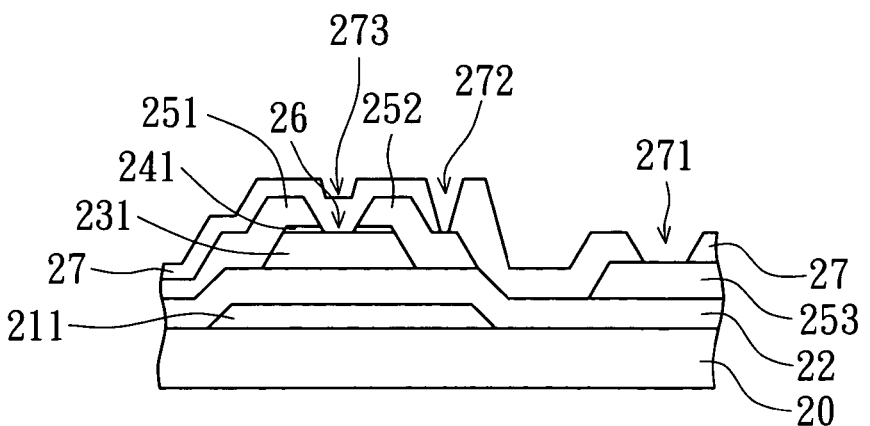

Next, a first via 271 and a second via 272 are formed on the passivation layer 27 for respectively exposing partial surfaces of the DL metal region 253 and partial surfaces of the drain metal region 252 as shown in FIG. 2H.

Figure 2I:
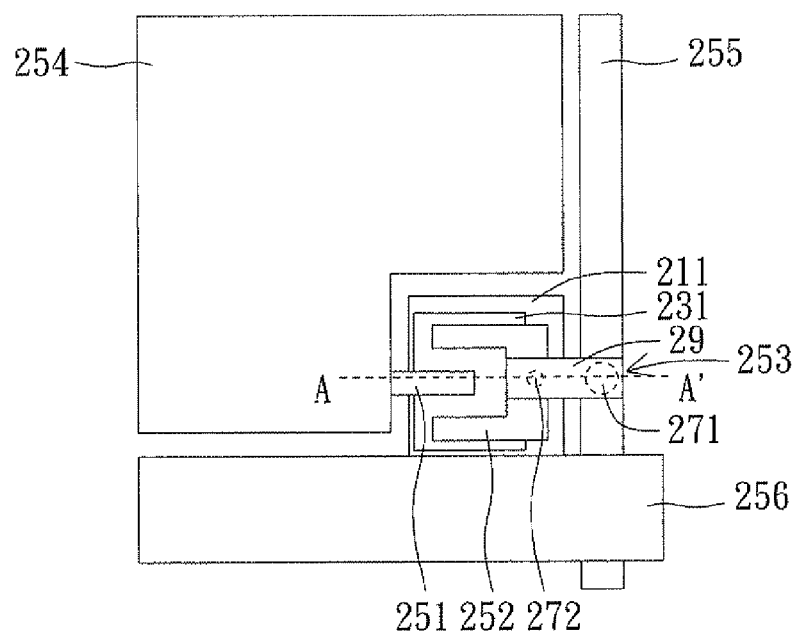

At last, a conductive layer 29 is formed on the passivation layer 27 covers the first via 271 and the second via 272 for electrically connecting the DL metal region 253 and the drain metal region 252 as shown in FIG. 2I. The conductive layer 29 can be made of indium tin oxide (ITO) for instance.

Figure 2J:
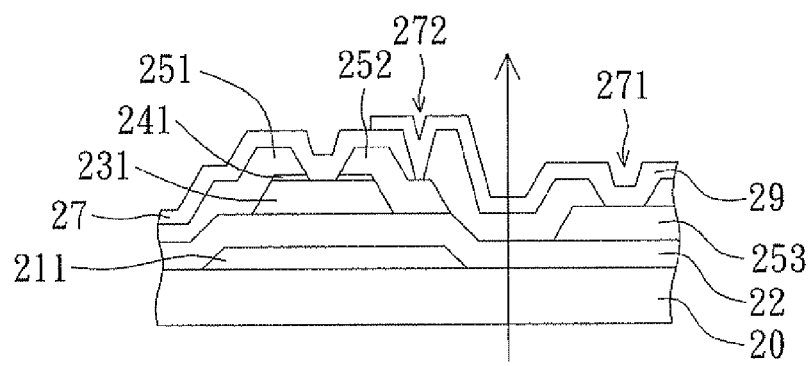

FIG. 2I is a top view of a TFT displaying device according to the first embodiment of the invention. FIG. 2J is a cross-sectional view of the TFT displaying device along the line A-A' of FIG. 2I. In the first embodiment, as shown in FIG. 2I, the source metal region 251 is coupled to a pixel electrode 254, the DL metal region 253 is coupled to a data line 255 and the gate electrode 211 is coupled to a gate line 256. The DL metal region 253 and the drain metal region 252 are electrically isolated, that is, the second metal layer 25 is disconnected first, and then the conductive layer 29 is used to bridge the disconnection. When the light is projected forward from below the substrate 20, the light can pass through directly as shown in the arrows of FIG. 2J, avoiding the conventional metal reflection problem as shown in FIG. 1. This is because the g-aSi region 231 has already been indented in the gate electrode 211, the DL metal region 253 and the drain metal region 252 do not have the second metal layer 25 to create reflection and that the ITO used to electrically connect the DL metal region 253 and the drain metal region 252 is a transparent material. Therefore, the TFT displaying device manufactured according to the five-mask manufacturing method of the first embodiment and the method of making the same effectively reduce photocurrent leakage.

Second Embodiment

Figure 3A:
FIG. 3A~3H illustrate a manufacturing method of a TFT displaying device according to a second embodiment of the invention.
Figure 3B:
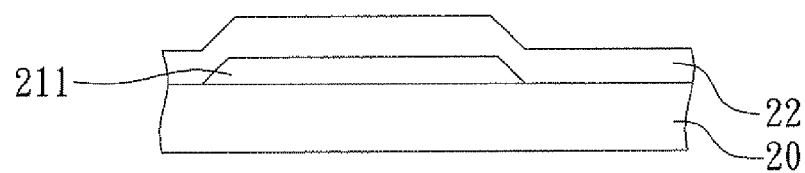
Figure 3C:
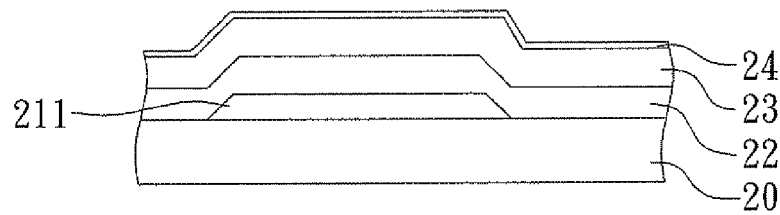

Refer to FIGS. 3A~3H, which illustrate a manufacturing method of a TFT displaying device according to a second embodiment of the invention. In the second embodiment, a four-mask manufacturing process is employed to manufacture a displaying device. Besides, the same devices used in both the second embodiment and the first embodiment follow the same labeling At first, a substrate 20 is formed, and a first metal layer 21 is formed on the substrate 20 as shown in FIG. 3A. Next, the first metal layer 21 is patterned to form the gate electrode 211, and a gate insulating layer 22 is formed on the substrate 20 and covers the gate electrode 211 as shown in FIG. 3B. Then, an a-Si layer 23 is formed on the gate insulating layer, and a doped a-Si layer such as an n+ a-Si layer 24 for instance is formed on the a-Si layer 23 as shown in FIG. 3C.

Figure 3D:
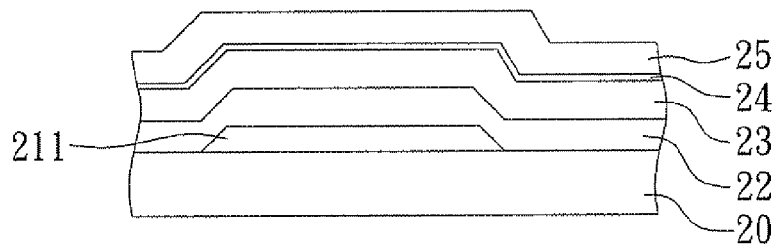

Afterwards, a second metal layer 25 is formed on the doped a-Si layer 24 as shown in FIG. 3D. Next, the second metal layer 25, the doped a-Si layer 24 and the a-Si layer 23 are patterned to form a source metal region 251, a drain metal region 252, a DL metal region 253, a doped g-aSi region 241, a doped DL-aSi region 242, the g-aSi region 231 and data-line a-Si region 232, as shown in FIG. 3E.

Figure 3E:
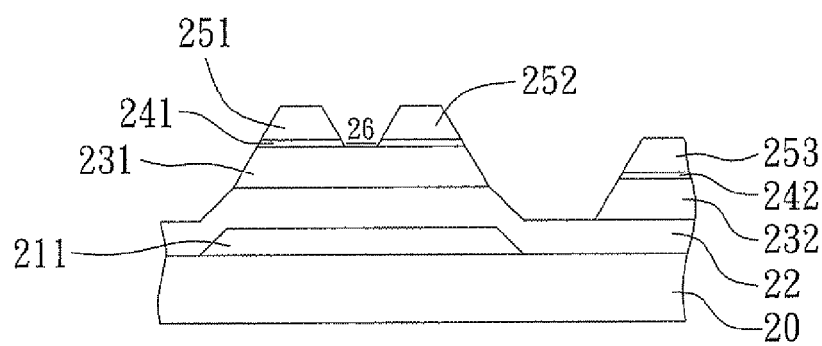

In FIG. 3E, a channel region 26 exists between the source metal region 251 and the drain metal region 252, and the source metal region 251 and the drain metal region 252 are correspondingly formed above the gate electrode 211. The DL metal region 253 and the drain metal region 252 are separated at an interval from each other. The data-line a-Si region 232 is formed below the DL metal region 253 and corresponds to the width of the DL metal region 253.

Figure 3F:
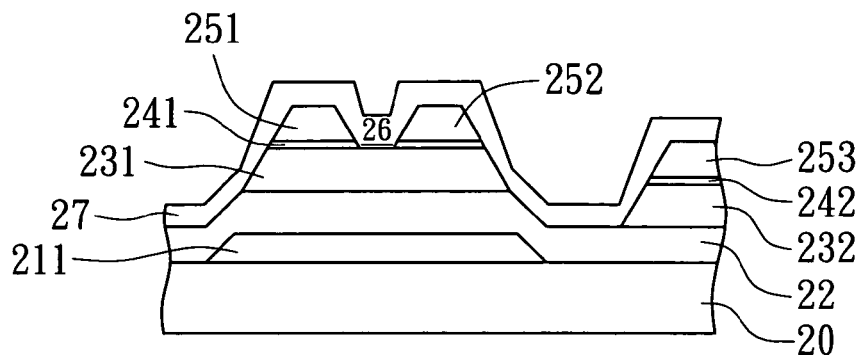

Then, a passivation layer 27 is formed on the gate insulating layer 22 and covers the source metal region 251, the drain metal region 252 and the DL metal region 253 as shown in FIG. 3F.

Figure 3G:
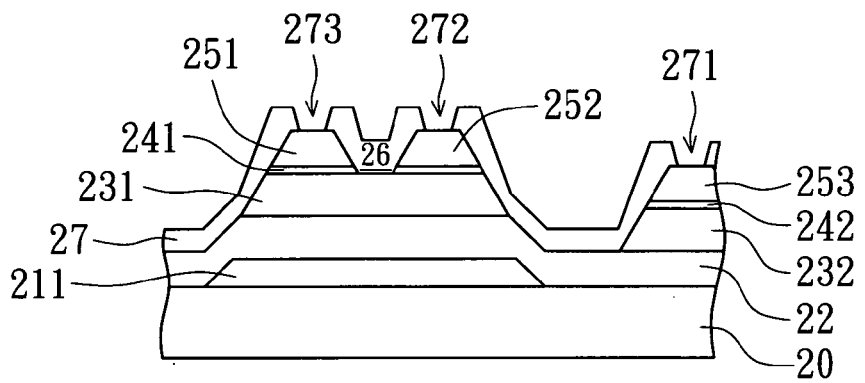

Next, a first via 271, a second via 272 and a third via 273 are formed on the passivation layer 27 for respectively exposing partial surfaces of the DL metal region 253, the drain metal region 252 and the source metal region 251 as shown in FIG. 3G.

Figure 3H:
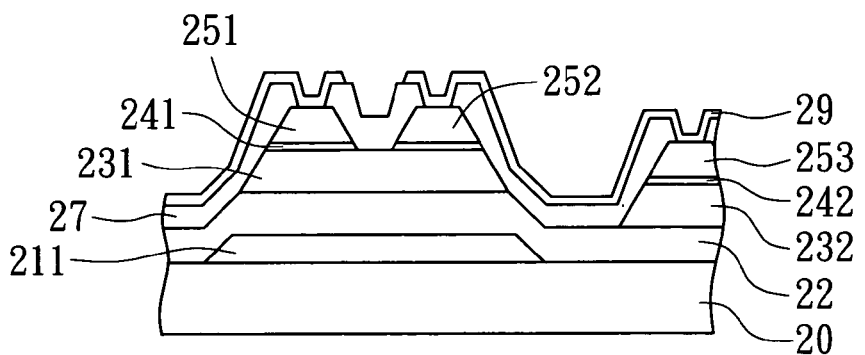

At last, a conductive layer 29 is formed on the passivation layer 27 and covers the first via 271, the second via 272 and the third via 273. The second via 272 and the third via 273 respectively formed on the drain metal region 252 and the source metal region 251 are electrically isolated as shown in FIG. 3H. The conductive layer 29 can be made of indium tin oxide (ITO) for instance.

FIG. 3H is a cross-sectional view of a TFT displaying device according to the second embodiment of the invention. In the second embodiment, the DL metal region 253 and the drain metal region 252 are electrically isolated; that is, the second metal layer 25 is disconnected first. The conductive layer 29 is then used to bridge the disconnection. The DL metal region 253 and the drain metal region 252 are electrically connected, but the drain metal region 252 and the source metal region 251 are electrically isolated. When the light is projected forward from below the substrate 20, the light can pass through directly as shown in the arrows of FIG. 3H, avoiding the conventional metal reflection problem as shown in FIG. 1. This is because the g-asi region 231 has already been indented in the gate electrode 211, the DL metal region 253 and the drain metal region 252 do not have the second metal layer 25 to create reflection and that the ITO used to electrically connect the DL metal region 253 and the drain metal region 252 is a transparent material. Therefore, the TFT displaying device manufactured according to the five-mask manufacturing method of the second embodiment and the method of making the same effectively reduce photocurrent leakage.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region;
a data-line (DL) metal region directly connecting with a data line and formed on the gate insulating layer, wherein the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a continuous conductive layer formed on the passivation layer and covering the first via and the second via such that the DL metal region is electrically connected to the drain metal region via the continuous conductive layer.

2. The displaying device according to claim 1, further comprising a doped g-aSi region formed on the g-aSi region and located under the source metal region and the drain metal region.

3. The displaying device according to claim 1, wherein an area of the g-aSi region is smaller than an area of the gate electrode positioned therebelow.

4. The displaying device according to claim 1, wherein the gate insulating layer comprises a silicon nitride layer.

5. The displaying device according to claim 1, wherein the conductive layer comprises an indium tin oxide (ITO) layer.

6. The displaying device according to claim 1, further comprising a data-line a-Si region, wherein the DL metal region is formed on the data-line a-Si region.

7. The displaying device according to claim 6, further comprising a doped DL-aSi region between the DL metal region and the data-line a-Si region.

8. The displaying device according to claim 6, wherein the passivation layer further comprises a third via for exposing partial surfaces of the source metal region.

9. The displaying device according to claim 6, wherein the conductive layer further covers the third via, and the second via and the third via are electrically isolated.

10. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region;
a data-line (DL) metal region directly connecting with a data line and formed on the gate insulating layer, wherein the DL metal region and the drain metal region are located at the same side of the source metal region and the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a conductive layer formed on the passivation layer and covering the first via and the second via for electrically connecting the DL metal region and the drain metal region.

11. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region, wherein the drain metal region is completely overlapped with the gate electrode;
a data-line (DL) metal region, wherein the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a continuous conductive layer formed on the passivation layer and covering the first via and the second via such that the DL metal region is electrically connected to the drain metal region via the continuous conductive layer.

12. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region, wherein the drain metal region is completely overlapped with the gate electrode;
a data-line (DL) metal region, wherein the DL metal region and the drain metal region are located at the same side of the source metal region and the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a conductive layer formed on the passivation layer and covering the first via and the second via for electrically connecting the DL metal region and the drain metal region.

13. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region, wherein the source metal region is directly connected to a pixel electrode;
a data-line (DL) metal region directly connecting with a data line and formed on the gate insulating layer, wherein the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a continuous conductive layer formed on the passivation layer and covering the first via and the second via such that the DL metal region is electrically connected to the drain metal region via the continuous conductive layer.

14. A displaying device, comprising:
a substrate;
a gate electrode formed on the substrate;
a gate insulating layer covering the gate electrode;
a gate amorphous silicon region (g-aSi) formed on the gate insulating layer and correspondingly positioned above the gate electrode;
a source metal region and a drain metal region formed on the g-aSi region;
a data-line (DL) metal region being a part of a data line and formed on the gate insulating layer, wherein the DL metal region is separated from the drain metal region at an interval;
a passivation layer formed on the gate insulating layer and covering the source metal region, the drain metal region and the DL metal region, wherein the passivation layer comprises a first via and a second via for respectively exposing partial surfaces of the DL metal region and partial surfaces of the drain metal region; and
a continuous conductive layer formed on the passivation layer and covering the first via and the second via such that the DL metal region is electrically connected to the drain metal region via the continuous conductive layer.

* * * * *